United States Patent
Chung et al.

(10) Patent No.: US 8,410,665 B2
(45) Date of Patent: Apr. 2, 2013

(54) MEMS KINETIC ENERGY CONVERSION

(75) Inventors: Tien-Kan Chung, Pingzhen (TW); Chung-Hsien Lin, Hsinchu (TW); Yao-Te Huang, Hsinchu (TW); Chia-Hua Chu, Zhubei (TW); Chia-Ming Hung, Taipei (TW); Wen-Chuan Tai, Dayuan Township, Taoyuan County (TW); Chang-Yi Yang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 197 days.

(21) Appl. No.: 12/977,304

(22) Filed: Dec. 23, 2010

(65) Prior Publication Data

US 2012/0161582 A1 Jun. 28, 2012

(51) Int. Cl.
 *H01L 41/08* (2006.01)
(52) U.S. Cl. .................................................. 310/334
(58) Field of Classification Search .................. None
 See application file for complete search history.

(56) References Cited

U.S. PATENT DOCUMENTS

| | | | |
|---|---|---|---|
| 7,057,330 B2 | 6/2006 | Buhler et al. | |
| 7,567,013 B2 | 7/2009 | Lu et al. | |
| 7,579,757 B2 | 8/2009 | Kulah et al. | |
| 7,687,977 B2 | 3/2010 | Xu | |
| 8,281,660 B2* | 10/2012 | Paci et al. | 73/580 |
| 2003/0030527 A1* | 2/2003 | Mhani et al. | 336/130 |
| 2010/0154544 A1* | 6/2010 | Paci et al. | 73/579 |
| 2011/0193661 A1* | 8/2011 | Baks et al. | 335/136 |
| 2011/0194164 A1* | 8/2011 | Chou et al. | 359/200.6 |
| 2011/0228367 A1* | 9/2011 | Lubianiker et al. | 359/199.2 |
| 2012/0092420 A1* | 4/2012 | Silverbrook | 347/54 |
| 2012/0226133 A1* | 9/2012 | Wong et al. | 600/398 |

OTHER PUBLICATIONS

Y.B. Jeon et al., "MEMS Power Generator With Transverse Mode Thin Film PZT", 0924-4247, 2005 Elsevier B.V, pp. 16-22.
R. Elfrink et al., "Vibration Energy Harvesting With Aluminum Nitride-Based Piezoelectric Devices", Journal of Mircomechanics and Microengineering, J. Micromech. Microeng. 19 (2009) 094005 (8 pp).
C. Shearwood et al., "Development of an Electromagnetic Microgenerator", Electronics Letters, Oct. 23, 1997, vol. 33, No. 22, pp. 1883-1884.
Haluk Külah et al., "Energy Scavenging From Low-Frequency Vibrations by Using Frequency Up-Conversion for Wireless Sensor Applications", IEEE Sensors Journal, vol. 8, No. 3, Mar. 2008, pp. 261-268.
Bozidar Marinkovic et al., "Smart Sand—A Wide Bandwidth Vibration Energy Harvesting Platform", Applied Physics Letters 94, 103505 (2009), 3 pages.

* cited by examiner

*Primary Examiner* — Mark Budd
(74) *Attorney, Agent, or Firm* — Haynes and Boone, LLP

(57) ABSTRACT

The present disclosure provides a micro device. The device has a micro-electro-mechanical systems (MEMS) movable structure, a plurality of metal loops over the MEMS movable structure, and a piezoelectric element over the MEMS movable structure. Frontside and backside capping wafers are bonded to the MEMS structure, with the frontside and backside capping wafers encapsulating the MEMS movable structure, the plurality of metal loops, and the piezoelectric element. The device further includes a magnet disposed on the frontside capping wafer over the plurality of metal loops.

14 Claims, 9 Drawing Sheets

MEMS KINETIC ENERGY CONVERSION

BACKGROUND

Micro-electro-mechanical systems (MEMS) devices can harvest energy for various applications, such as self-powered or battery-charging devices or systems. Such MEMS devices can harvest energy, for example, by converting mechanical kinetic energy (e.g., environmental vibration) into electrical energy (e.g., electrical charge) and subsequently power a device or charge a battery.

However, there are several limitations to current MEMS energy harvesters. Conventional MEMS piezoelectric devices using a lead-zirconium-titanium (PZT) thin film material to convert energy have environmental and processing tool contamination issues. Conventional MEMS piezoelectric devices using an aluminum-nitride (AlN) thin film material cannot generate larger amounts of power because AlN has a lower piezoelectric coefficient when compared with PZT. Furthermore, conventional MEMS piezoelectric devices are limited to converting kinetic energy from mechanical deformation but not based on structural displacement, velocity, and acceleration (especially when the later three kinds of motion are with zero-deformation, i.e., no deformation).

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
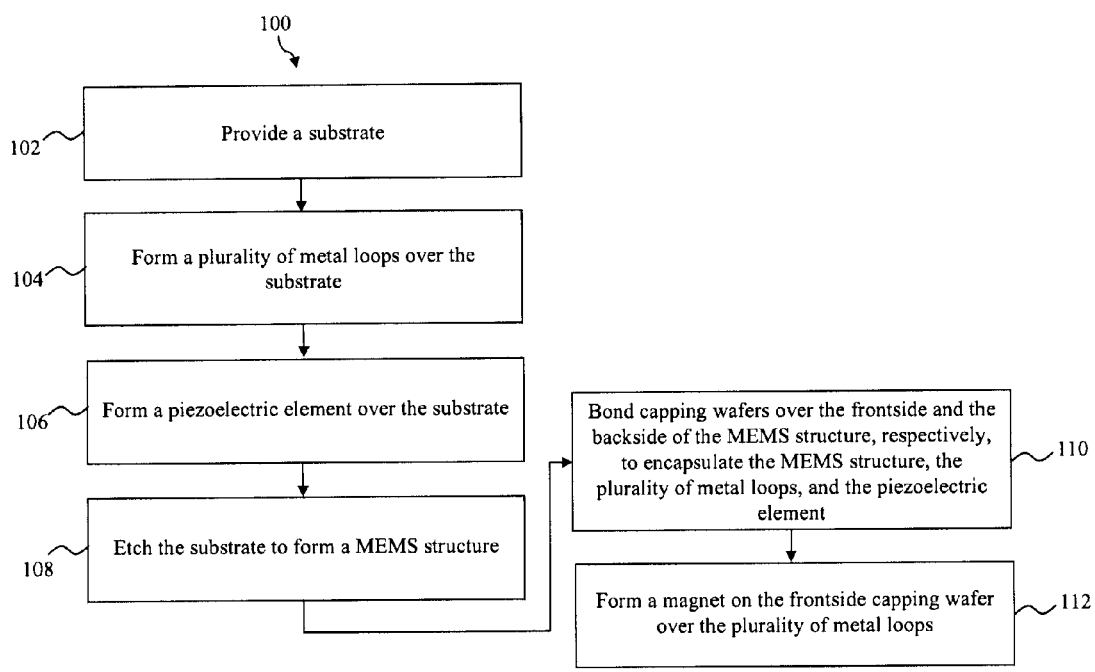
FIG. 1 is a flowchart of a method of fabricating a micro device for kinetic energy conversion in accordance with an embodiment of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

It is understood that several processing steps and/or features of a device may be only briefly described, such steps and/or features being well known to those of ordinary skill in the art. Also, additional processing steps or features can be added, and certain of the following processing steps or features can be removed and/or changed while still implementing the claims. Thus, the following description should be understood to represent examples only, and are not intended to suggest that one or more steps or features is required.

It is further understood that the present disclosure refers generally to WLP to refer to the packaging of a substrate. The substrates described herein may take various forms including but not limited to wafers (or portions thereof) having integrated circuits including those formed by CMOS-based processes, die, micro-electro-mechanical systems (MEMS) substrates, capping substrates, a single substrate with CMOS devices and MEMS devices formed thereon, and the like. In contrast, a carrier wafer may not include an integrated circuit. Furthermore, as described above, specific embodiments may be described herein which are exemplary only and not intended to be limiting. For example, embodiments that refer to a substrate being a MEMS substrate, a CMOS substrate, or the like are exemplary only and not intended to limit the disclosure to any particular technology.

FIG. 1 is a flowchart illustrating a method 100 for fabricating a hybrid piezoelectric-electromagnetic energy harvesting device in accordance with an embodiment of the present disclosure. The method 100 begins at block 102 where a substrate is provided. The substrate may be part of a complementary metal-oxide semiconductor (CMOS) region, a separate region on a same die as the CMOS region, or another die.

At block 104, a plurality of metal loops are formed over the substrate. In one example, the plurality of metal loops may be deposited and patterned in a complementary metal-oxide semiconductor (CMOS) process, or the metal loops may be electroplated on top of a CMOS wafer. In another example, the plurality of metal loops may include at least two sets of metal coils above one another and separated by at least one dielectric layer. It is noted that with more coil sets, better energy-harvesting results.

At block 106, a piezoelectric element is formed over the substrate. In one example, the piezoelectric element may include a bottom metal layer, an AlN layer above the bottom metal layer, and a top metal layer above the AlN layer. In another example, the piezoelectric element may be formed between the two sets of metal coils.

At block 108, the substrate is etched to form a MEMS structure. In one example, the MEMS structure may be formed as one of an off-resonant structure, a cantilever structure with a proof mass, or a diaphragm structure.

At block 110, frontside and backside capping wafers are bonded over the frontside and backside of the MEMS structure, respectively, to encapsulate the MEMS movable structure, the plurality of metal loops, and the piezoelectric element between the frontside and backside capping wafers. In one example, the frontside and backside capping wafers are bonded to the MEMS structure via benzocyclobutene (BCB) bonds or eutectic bonds.

At block 112, a magnet is formed on the frontside capping wafer over the plurality of metal loops. A second magnet may be disposed on the backside capping wafer under the plurality of metal loops. In one example, the magnet may be comprised of an alloy of neodymium, iron, and boron.

Accordingly, method 100 provides for the fabrication of a hybrid MEMS piezoelectric-electromagnetic energy harvesting device. As noted above, the MEMS device may be formed over various semiconductor devices, and/or other suitable active and/or passive devices. Example semiconductor devices include integrated circuits including a metal-insulator-semiconductor field effect transistor (MOSFET) including complementary MOSFET (CMOS) features, CIS, and/or other suitable active and/or passive devices. In an embodiment, the MEMS device includes an integrated circuit (or portion thereof) designed and formed using a CMOS-based process. A substrate including a semiconductor device formed using CMOS technology may be referred to herein as a CMOS substrate or a CMOS wafer. A MEMS device or substrate may be a silicon wafer including MEMS features and/or functionalities. A substrate having a device (e.g., integrated circuit) formed by other semiconductor fabrication technologies is also within the scope of the described method.

In one example, the MEMS device substrate and/or the capping wafer is comprised of silicon. Alternatively or additionally, the substrate of the MEMS device, the semiconductor device, and/or the capping wafer may include other elementary semiconductor, such as germanium, or the substrate may include a compound semiconductor, such as silicon carbide, gallium arsenic, indium arsenide, and/or indium phosphide.

Figure 2:
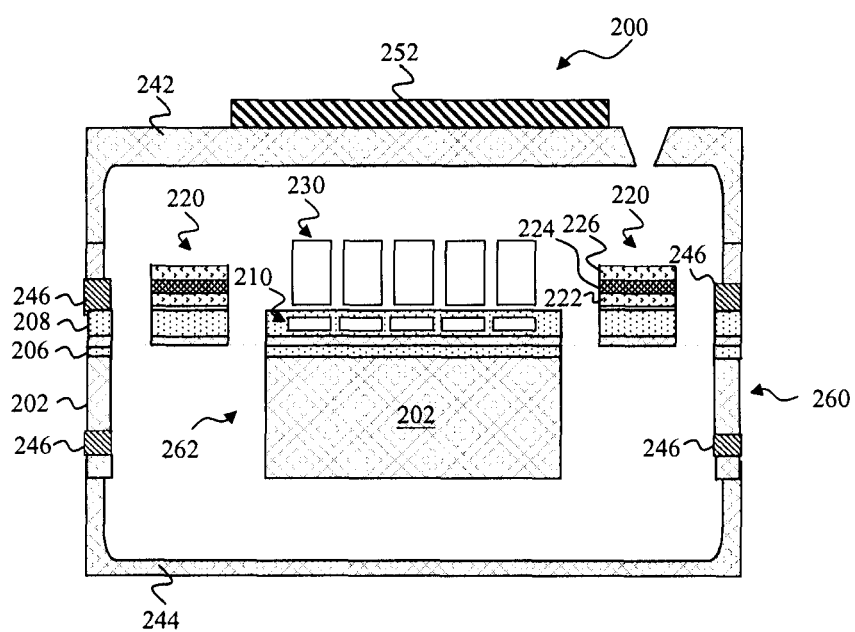
FIG. 2 is a cross-sectional view of a MEMS kinetic energy conversion device in accordance with an embodiment of the present disclosure.

Referring now to FIG. 2, a cross-sectional view of a micro device 200 is illustrated in accordance with an embodiment of the present disclosure. Device 200 may be referred to as a hybrid MEMS piezoelectric-electromagnetic energy harvesting device or a MEMS kinetic energy conversion device in accordance with an embodiment of the present disclosure.

Micro device 200 includes a micro-electro-mechanical systems (MEMS) structure 260 having a MEMS movable structure 262. In this embodiment, MEMS movable structure 262 is an off-resonant structure and includes a substrate 202, a buried oxide layer 206, and a frontside dielectric layer 208, such as an inter-metal dielectric. Device 200 further includes a plurality of metal loops 210 disposed over the MEMS movable structure 262, and a piezoelectric element 220 disposed over the MEMS movable structure 262. Frontside and backside capping wafers 242, 244 are bonded to the MEMS structure 260, thereby encapsulating the MEMS movable structure 262, the plurality of metal loops 210, and the piezoelectric element 220. A magnet 252 is disposed on the frontside capping wafer 242 over the plurality of metal loops 210.

According to one embodiment of the present disclosure, substrate 202 includes a silicon-on-insulator (SOI) wafer and a CMOS device. Substrate 202 is comprised of single crystal silicon in one example, but may be comprised of other materials and include other structures as noted above.

According to one embodiment of the present disclosure, the plurality of metal loops 210 includes more than one layer of metal loops above one another and interconnected to form a metal coil. A dielectric layer may be formed between the layers of metal loops. According to another embodiment, a second set of a plurality of metal loops 230 is formed above the first set of plurality of metal loops 210. Similarly, the plurality of metal loops 230 may also include more than one layer of metal loops above one another and interconnected to form a second metal coil. A dielectric layer may also be formed between the layers of the second set of metal loops. The two sets of metal coils 210, 230 are separated by at least one dielectric layer. In one embodiment, a seed layer for metal electroplating may be deposited on top of a CMOS region, and a thick photoresist may be deposited on top of the seed layer and subsequently patterned as a template. Multiple layers of metal loops can then be electroplated in the template to obtain a 3-D coil.

According to one embodiment, the piezoelectric element 220 includes a bottom metal layer 222, a piezoelectric layer 224 (e.g., an aluminum nitride (AlN) layer) over the bottom metal layer 222, and a top metal layer 226 over the piezoelectric layer 224. In one example, the bottom metal layer 222 may function as a buffer/seed layer and/or a bottom electrode, and may be comprised of various metals, such as but not limited to Pt/Ti, Mo/Ti, Ti, Al, AlCu, etc. In one example, the top metal layer 226 may function as an interdigitated electrode and/or top electrode and may be comprised of various metals, such as but not limited to Pt, Mo, Al, Ti, AlCu, etc.

According to one embodiment, the frontside and backside capping wafers 242, 244 are comprised of silicon and may be bonded to the MEMS structure 260 via bonds 246, such as but not limited to benzocyclobutene (BCB) bonds or eutectic bonds.

According to one embodiment, magnet 252 is comprised of an alloy of neodymium, iron, and boron, although not limited to such metals. In other embodiments, as will be shown and described below with respect to FIGS. 5 and 6, a second magnet may be formed on the backside capping wafer 244 below the plurality of metal loops.

Figure 3A:
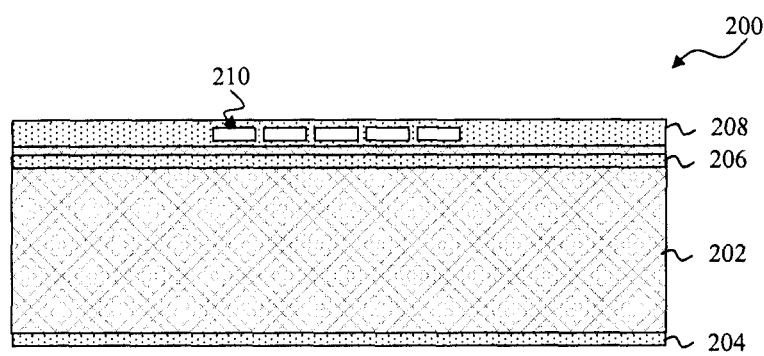
FIGS. 3A-3F are cross-sectional views of the MEMS kinetic energy conversion device of FIG. 2 at various stages of fabrication in accordance with an embodiment of the present disclosure.

Referring now to FIGS. 3A-3F, cross-sectional views of the micro device 200 are illustrated at various stages of fabrication in accordance with an embodiment of the present disclosure. FIG. 3A illustrates a substrate 202 including a backside dielectric layer 204, a buried oxide layer 206, and a frontside dielectric layer 208. Substrate 202 is comprised of single crystal silicon in one example, but may be comprised of other materials and include other structures as noted above. FIG. 3A further illustrates the formation of the plurality of metal loops 210 within frontside dielectric layer 208. The plurality of metal loops 210 may be deposited and patterned as part of a CMOS process and/or may be deposited and patterned in an electroplating process on top of a CMOS substrate. Although only one layer is illustrated in FIG. 3A, the plurality of metal loops 210 may include more than one layer of metal loops as noted above and illustrated and described below with respect to FIGS. 4A-4D. Dielectric layers may be formed between the plurality of metal loop layers, which may be interconnected through the dielectric layers to form a 3-D metal coil.

Figure 3B:
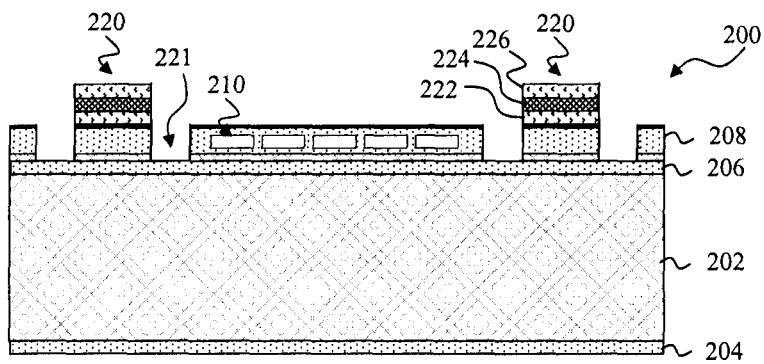

FIG. 3B illustrates the formation of piezoelectric elements 220, which includes the deposition of bottom metal layer 222, piezoelectric layer 224 (e.g., an aluminum nitride (AlN) layer) over the bottom metal layer 222, and top metal layer 226 over the piezoelectric layer 224. As noted above, in one example, the bottom metal layer 222 may function as a buffer/seed layer and/or a bottom electrode, and may be comprised of various metals, such as but not limited to Pt/Ti, Mo/Ti, Ti, Al, AlCu, etc. In one example, the top metal layer 226 may function as an interdigitated electrode and/or top electrode and may be comprised of various metals, such as but not limited to Pt, Mo, Al, Ti, AlCu, etc. The metal electrode layers may be deposited by conventional techniques and processes, such as by various PVD, CVD, and/or electroplating techniques. The piezoelectric layer may be deposited by conventional techniques and processes, such as by various PVD and CVD techniques. These layers can then be patterned by conventional techniques and processes, such as by various photolithographic patterning and etching techniques. After the deposition and patterning of the piezoelectric elements 220, trenches 221 are formed in the frontside dielectric layer 208 and top surface of the substrate between piezoelectric elements 220 and the plurality of metal loops 210. Trenches 221 may be formed by oxide dry-etching in one example.

Figure 3C:
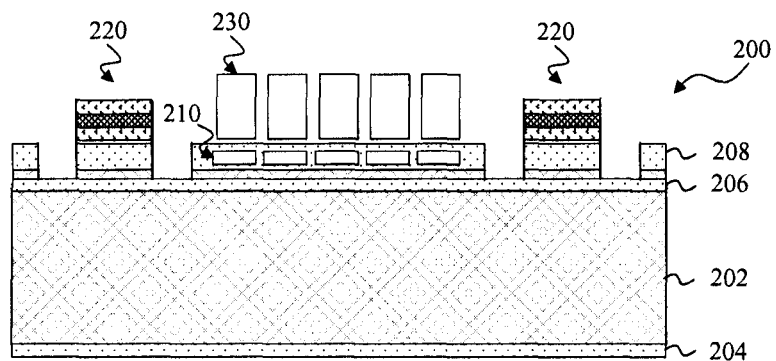

FIG. 3C illustrates the formation of the second set of plurality of metal loops 230 formed above the first set of plurality of metal loops 210. Similarly, the plurality of metal loops 230 may also include more than one layer of metal loops above one another and interconnected to form a second metal coil. A dielectric layer may also be formed between the layers of the second set of metal loops 230. The two sets of metal coils 210, 230 are separated by at least one dielectric layer.

Figure 3D:
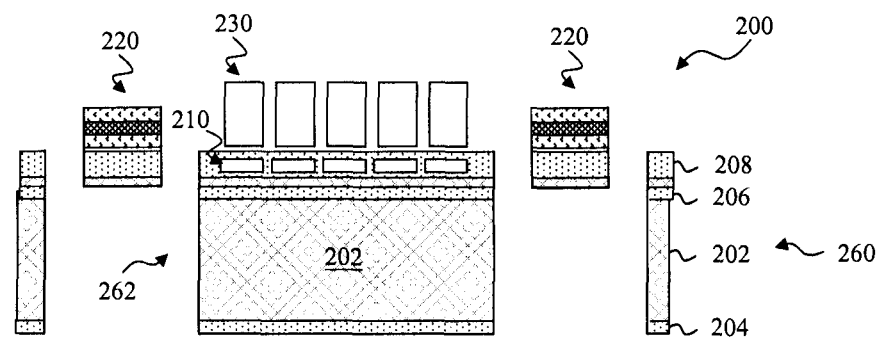

FIG. 3D illustrates the etching of substrate 202, buried oxide layer 206, and frontside dielectric layer 208 to form the MEMS structure 260 and MEMS movable structure 262. In this embodiment, MEMS movable structure 262 is an off-resonant structure. In one example, an isotropic oxide etcher with $CF_4$ etchant gas may be used in conjunction with a patterned photoresist for the patterned etch of the dielectric layers and substrate 202. In another example, backside dielectric layer 204 is patterned and used as an etching mask for bulk silicon etching of substrate 202. The bulk silicon may be etched by fast silicon dry-etching until the frontside dielectric layer 206 is exposed and subsequently etched to release the MEMS movable structure. Other etch techniques and processes may be used.

Figures 3E, 3F:
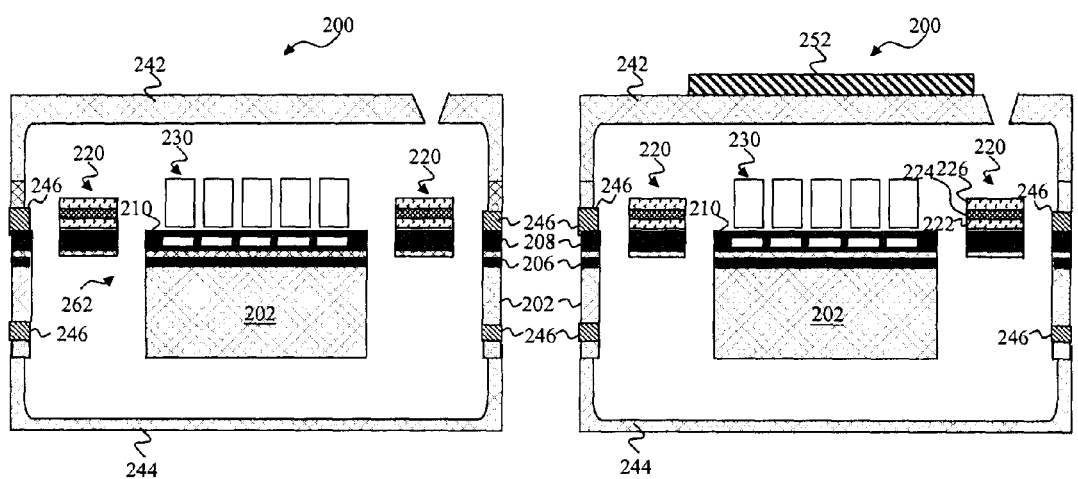

FIG. 3E illustrates the bonding of frontside and backside capping wafers 242, 244 to the MEMS structure 260, thereby encapsulating the MEMS movable structure 262, the plurality of metal loops 210, and the piezoelectric element 220 between the frontside and backside capping wafers 242, 244. As noted above, according to one embodiment, the frontside and backside capping wafers 242, 244 may be bonded to the MEMS structure 260 via bonds 246, such as but not limited to benzocyclobutene (BCB) bonds or eutectic bonds.

After capping wafer bonding and dicing, each device is packaged in vacuum in one embodiment. After packaging, the device is bound with a hard magnet by adhesive binding. FIG. 3F illustrates the formation of magnet 252 on the frontside capping wafer 242 over the plurality of metal loops 210. As noted above, magnet 252 is comprised of an alloy of neodymium, iron, and boron, in one example, although not limited to such metals. Magnet 252 may be adhesively bound to the capping wafer in one example.

Figure 4A:
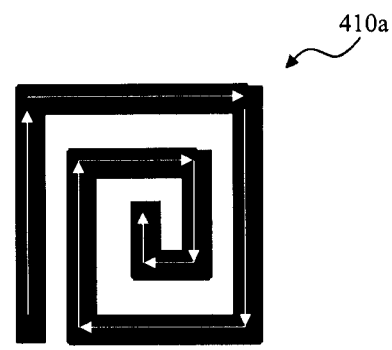
FIGS. 4A-4D illustrate top views of a set of multilayer metal loops which are interconnected and have a dielectric layer between each layer of metal loops.
Figure 4B:
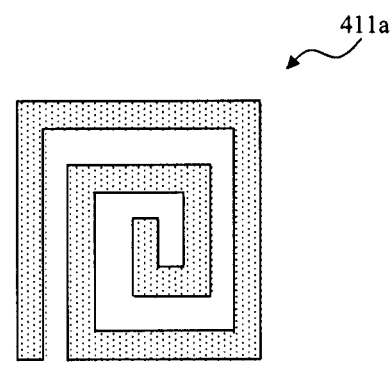
Figure 4C:
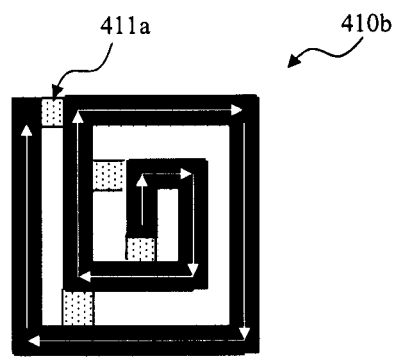
Figure 4D:
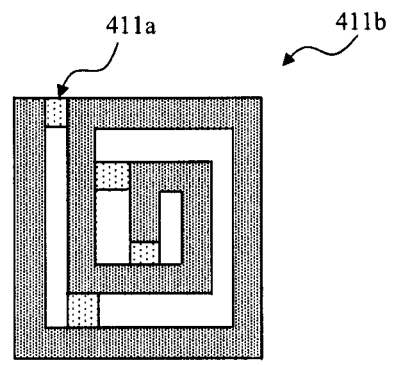

FIGS. 4A-4D illustrate top views of a set of multilayer metal loops (e.g., metal loops 210, 230) which are interconnected and have a dielectric layer between each layer of metal loops to form a metal coil. FIG. 4A illustrates a first metal layer 410a formed to have a plurality of loops. The arrows indicate a direction of the inducting current in one example. FIG. 4B illustrates a first inter-metal dielectric layer 411a formed directly over first metal layer 410a. FIG. 4C illustrates a second metal layer 410b formed directly over the first inter-metal dielectric layer 411a of FIG. 4B. The arrows again indicate a direction of the inducting current in one example. FIG. 4D illustrates a second inter-metal dielectric layer 411b formed directly over the second metal layer 410b of FIG. 4C. Metal vias are formed through the inter-metal dielectric layers 411a, 411b (which may be planarized and patterned to form a via aperture) to interconnect the first and second metal layers 410a, 410b. This stacking of metal layer and inter-metal dielectric layer may be repeated to form a 3-D metal coil having a desired number of metal layers. When the plurality of metal loops (e.g., metal coils) move transversely in an external magnetic field formed by two parallel hard magnets attached on the outer side of the capping wafers, an inducing current is generated in the coil due to electromagnetic induction.

As noted above, the substrate 202 in this embodiment includes a CMOS wafer and the electromagnetic and piezoelectric elements are formed over the CMOS wafer. Alternatively, the substrate 202 may be a carrier wafer (optionally including a stand-off feature) and may not include an integrated circuit. Accordingly, in a first scheme, the substrate may be part of a complementary metal-oxide semiconductor (CMOS) region; in a second scheme, the substrate may be in a separate region on a same die as the CMOS region (e.g., side by side); and in a third scheme, the substrate may be in one die and the CMOS IC in another die.

Thus, the present disclosure provides for a hybrid piezoelectric-electromagnetic energy harvesting device. When the device experiences environmental/mechanical vibrations, the MEMS movable structure deflects accordingly, and due to mechanical coupling of a piezoelectric thin film disposed on top of the movable structure, strains caused by the deflected movable structure transmit to the piezoelectric film, which are transformed to electrical charge. In addition, when the plurality of metal loops (e.g., a metal coil) disposed on top of the movable structure moves transversely in an external magnetic field formed by hard magnets, an inducing current is generated in the coil due to electromagnetic induction, which can also be harvested.

Advantageously, the present disclosure provides a hybrid piezoelectric-electromagnetic energy harvesting device applicable to converting kinetic energy from a full scope of motion such as deformation, displacement, velocity, and/or acceleration (even when the later three kinds of motion are with zero-deformation) and with enhanced power-generation capability. The present disclosure is also advantageously compatible with CMOS processes. Furthermore, the present disclosure provides for an energy harvesting device with substantially no stiction, no mechanical wear, and no environmental contamination. Furthermore, the present disclosure is applicable to the fabrication of both a stand-alone MEMS device or a monolithic semiconductor-MEMS device.

Figure 5:
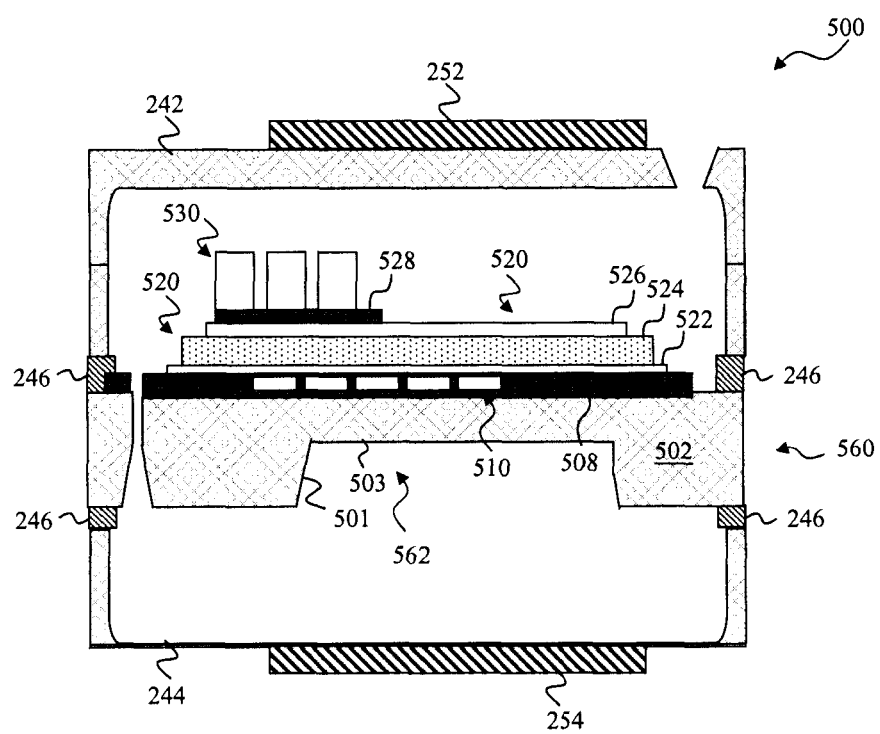
FIG. 5 is a cross-sectional view of a MEMS kinetic energy conversion device in accordance with another embodiment of the present disclosure.

Referring now to FIG. 5, a cross-sectional view of a micro device 500 is illustrated in accordance with another embodiment of the present disclosure. Micro device 500 may include substantially similar structures as those described above and illustrated with respect to FIGS. 2, 3A-3F, and 4A-4D, and are fully applicable in this embodiment although repetitive descriptions may not be included below to avoid prolix description.

Micro device 500 includes a MEMS structure 560 having a MEMS movable structure 562. In this embodiment, MEMS movable structure 562 includes a cantilever structure with a proof mass 501 and bridge 503 formed from a substrate 502, and a frontside dielectric layer 508, such as an inter-metal dielectric, formed over the substrate 502. Device 500 further includes a plurality of metal loops 510 disposed over the MEMS movable structure 562, and a piezoelectric element 520 disposed over the MEMS movable structure 562. Frontside and backside capping wafers 242, 244 are bonded to the MEMS structure 560, thereby encapsulating the MEMS movable structure 562, the plurality of metal loops 510, and the piezoelectric element 520. A first magnet 252 is disposed on the frontside capping wafer 242 over the plurality of metal loops 510, and a second magnet 254 is disposed on the backside capping wafer 244 under the plurality of metal loops 510.

According to one embodiment of the present disclosure, the plurality of metal loops 510 includes more than one layer of metal loops above one another and interconnected to form a metal coil, as described above with respect to FIGS. 4A-4D. A dielectric layer may be formed between the layers of metal loops.

According to one embodiment, a second set of a plurality of metal loops 530 is formed above the first set of plurality of metal loops 510. Similarly, the plurality of metal loops 530 may also include more than one layer of metal loops above one another and interconnected to form a second metal coil. A dielectric layer may also be formed between the layers of the second set of metal loops. The two sets of metal loops 510, 530 are separated by at least one dielectric layer, and in this embodiment, piezoelectric element 520 is disposed between the two sets of metal loops 510, 530.

According to one embodiment, the piezoelectric element 520 includes a bottom metal layer 522, a piezoelectric layer 524 (e.g., an aluminum nitride (AlN) layer) over the bottom metal layer 522, and a top metal layer 526 over the piezoelectric layer 524. In one example, the bottom metal layer 522 may function as a buffer/seed layer and/or a bottom electrode, and may be comprised of various metals, such as but not limited to Pt/Ti, Mo/Ti, Ti, Al, AlCu, etc. In one example, the top metal layer 526 may function as an interdigitated electrode and/or top electrode and may be comprised of various metals, such as but not limited to Pt, Mo, Al, Tl, AlCu, etc. A dielectric layer 528 separates top metal layer 526 of the piezoelectric element 520 from the second set of metal loops 530.

According to one embodiment, magnets 252 and 254 are comprised of an alloy of neodymium, iron, and boron, although not limited to such metals.

Figure 6:
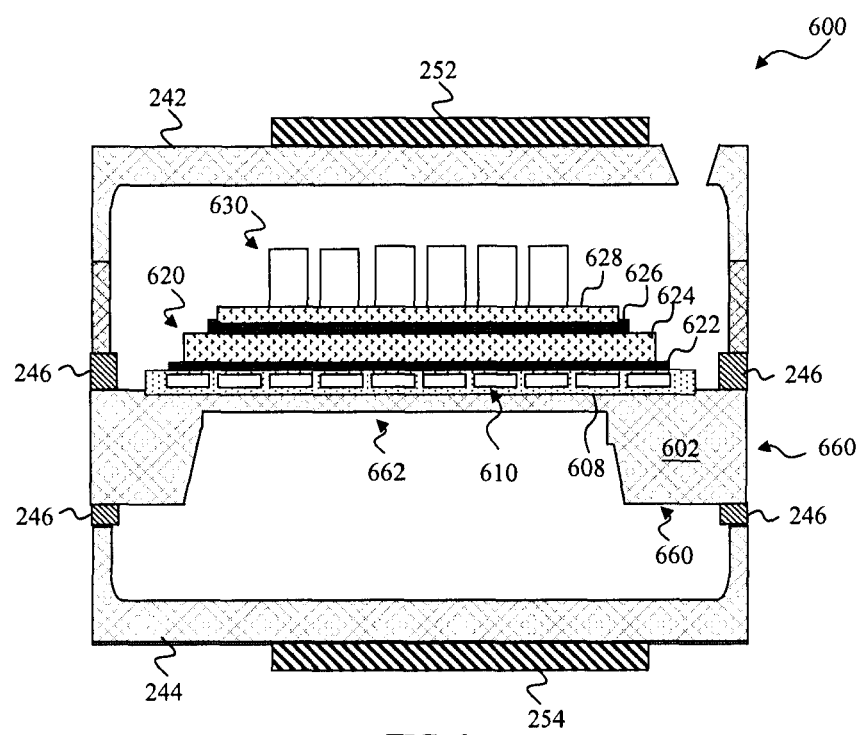
FIG. 6 is a cross-sectional view of a MEMS kinetic energy conversion device in accordance with another embodiment of the present disclosure.

Referring now to FIG. 6, a cross-sectional view of a micro device 600 is illustrated in accordance with another embodiment of the present disclosure. Micro device 500 may include substantially similar structures as those described above and illustrated with respect to FIGS. 2, 3A-3F, 4A-4D, and 5, and are fully applicable in this embodiment although repetitive descriptions may not be included below to avoid prolix description.

Micro device 600 includes a MEMS structure 660 having a MEMS movable structure 662. In this embodiment, MEMS movable structure 662 includes a diaphragm structure formed from a substrate 602, and a frontside dielectric layer 608, such as an inter-metal dielectric, formed over the substrate 602. Device 600 further includes a plurality of metal loops 610 disposed over the MEMS movable structure 662, and a piezoelectric element 620 disposed over the MEMS movable structure 662. Frontside and backside capping wafers 242, 244 are bonded to the MEMS structure 660, thereby encapsulating the MEMS movable structure 662, the plurality of metal loops 610, and the piezoelectric element 620. First magnet 252 is disposed on the frontside capping wafer 242 over the plurality of metal loops 610, and second magnet 254 is disposed on the backside capping wafer 244 under the plurality of metal loops 610.

According to one embodiment of the present disclosure, the plurality of metal loops 610 includes more than one layer of metal loops above one another and interconnected to form a metal coil, as described above with respect to FIGS. 4A-4D. A dielectric layer may be formed between the layers of metal loops.

According to one embodiment, a second set of a plurality of metal loops 630 is formed above the first set of plurality of metal loops 610. Similarly, the plurality of metal loops 630 may also include more than one layer of metal loops above one another and interconnected to form a second metal coil. A dielectric layer may also be formed between the layers of the second set of metal loops. The two sets of metal loops 610, 630 are separated by at least one dielectric layer, and in this embodiment, piezoelectric element 620 is disposed between the two sets of metal loops 610, 630.

According to one embodiment, the piezoelectric element 620 includes a bottom metal layer 622, a piezoelectric layer 624 (e.g., an aluminum nitride (AlN) layer) over the bottom metal layer 622, and a top metal layer 626 over the piezoelectric layer 624. In one example, the bottom metal layer 622 may function as a buffer/seed layer and/or a bottom electrode, and may be comprised of various metals, such as but not limited to Pt/Ti, Mo/Ti, Ti, Al, AlCu, etc. In one example, the top metal layer 626 may function as an interdigitated electrode and/or top electrode and may be comprised of various metals, such as but not limited to Pt, Mo, Al, Tl, AlCu, etc. A dielectric layer 628 separates top metal layer 626 of the piezoelectric element 620 from the second set of metal loops 630.

Although the embodiments illustrated herein may describe and/or illustrate a single layer of metal loops or a single bonding layer deposited on a substrate, this is not required and any plurality of layers may be patterned to form one or more layers of metal loops or bonding regions between substrates or devices.

Thus, the present disclosure provides a micro device. In one embodiment, the device includes a micro-electro-mechanical systems (MEMS) structure having a MEMS movable structure, a plurality of metal loops over the MEMS movable structure, and a piezoelectric element over the MEMS movable structure. Frontside and backside capping wafers are bonded to the MEMS structure, with the frontside and backside capping wafers encapsulating the MEMS movable structure, the plurality of metal loops, and the piezoelectric element. The device further includes a magnet disposed on the frontside capping wafer over the plurality of metal loops.

The present disclosure provides another micro device. In one embodiment, the device includes a micro-electro-mechanical systems (MEMS) structure including a MEMS movable structure, a metal coil over the MEMS movable structure, and a piezoelectric element over the MEMS movable structure, the piezoelectric element including a bottom metal layer, an aluminum nitride (AlN) layer over the bottom metal layer, and a top metal layer over the AlN layer. The device further includes frontside and backside capping wafers bonded to the MEMS structure, with the frontside and backside capping wafers encapsulating the MEMS movable structure, the metal coil, and the piezoelectric element, and a magnet disposed on the frontside capping wafer over the metal coil.

A second magnet may be disposed on the backside capping wafer under the metal coil. Furthermore, a second metal coil may be disposed over the MEMS movable structure, wherein the piezoelectric element is between the second metal coil and the metal coil.

The present disclosure also provides a method of micro device fabrication. In one embodiment, a method includes providing a substrate, forming a plurality of metal loops over the substrate, forming a piezoelectric element over the substrate, and etching the substrate to form a micro-electromechanical systems (MEMS) structure including a MEMS movable structure. The method further includes bonding frontside and backside capping wafers to the MEMS structure to encapsulate the MEMS movable structure, the plurality of metal loops, and the piezoelectric element between the frontside and backside capping wafers, and forming a magnet on the frontside capping wafer over the plurality of metal loops.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A micro device, comprising:
   a micro-electro-mechanical systems (MEMS) structure including a MEMS movable structure;
   a plurality of metal loops over the MEMS movable structure;
   a piezoelectric element over the MEMS movable structure;
   frontside and backside capping wafers bonded to the MEMS structure, the frontside and backside capping wafers encapsulating the MEMS movable structure, the plurality of metal loops, and the piezoelectric element; and
   a magnet disposed on the frontside capping wafer over the plurality of metal loops.

2. The device of claim 1, wherein the MEMS movable structure is one of an off-resonant structure, a cantilever structure with a proof mass, or a diaphragm structure.

3. The device of claim 1, wherein the plurality of metal loops includes two sets of metal coils above one another and separated by at least one dielectric layer.

4. The device of claim 3, wherein the piezoelectric element is between the two sets of metal coils.

5. The device of claim 1, wherein the piezoelectric element includes a bottom metal layer, an aluminum nitride (AlN) layer over the bottom metal layer, and a top metal layer over the AlN layer.

6. The device of claim 1, wherein the frontside and backside capping wafers are bonded to the MEMS structure via benzocyclobutene (BCB) bonds or eutectic bonds.

7. The device of claim 1, wherein the magnet is comprised of an alloy of neodymium, iron, and boron.

8. The device of claim 1, further comprising a second magnet disposed on the backside capping wafer under the plurality of metal loops.

9. A micro device, comprising:
   a micro-electro-mechanical systems (MEMS) structure including a MEMS movable structure;
   a metal coil over the MEMS movable structure;
   a piezoelectric element over the MEMS movable structure, the piezoelectric element including a bottom metal layer, an aluminum nitride (AlN) layer over the bottom metal layer, and a top metal layer over the AlN layer;
   frontside and backside capping wafers bonded to the MEMS structure, the frontside and backside capping wafers encapsulating the MEMS movable structure, the metal coil, and the piezoelectric element; and
   a magnet disposed on the frontside capping wafer over the metal coil.

10. The device of claim 9, wherein the MEMS movable structure is one of an off-resonant structure, a cantilever structure with a proof mass, or a diaphragm structure.

11. The device of claim 9, wherein the frontside and backside capping wafers are bonded to the MEMS structure via benzocyclobutene (BCB) bonds or eutectic bonds.

12. The device of claim 9, wherein the magnet is comprised of an alloy of neodymium, iron, and boron.

13. The device of claim 9, further comprising a second magnet disposed on the backside capping wafer under the metal coil.

14. The device of claim 9, further comprising a second metal coil over the MEMS movable structure, wherein the piezoelectric element is between the second metal coil and the metal coil.

\* \* \* \* \*